United States Patent [19]

Matsuzawa et al.

[11] Patent Number: 4,614,706

[45] Date of Patent: Sep. 30, 1986

[54] METHOD OF FORMING A MICROSCOPIC PATTERN WITH FAR UV PATTERN EXPOSURE, ALKALINE SOLUTION DEVELOPMENT, AND DRY ETCHING

[75] Inventors: Toshiharu Matsuzawa, Higashimurayama; Takao Iwayanagi, Tokyo; Kikuo Douta, Hachioji; Hiroshi Yanazawa, Tokyo; Takahiro Kohashi, Hachioji; Saburo Nonogaki, Tokyo, all of Japan

[73] Assignee: Hitachi, Ltd., Tokyo, Japan

[21] Appl. No.: 606,216

[22] Filed: May 2, 1984

Related U.S. Application Data

[63] Continuation of Ser. No. 265,170, May 19, 1981, abandoned.

[30] Foreign Application Priority Data

May 19, 1980 [JP]  Japan ................... 55-65404

[51] Int. Cl.$^4$ ............ G03F 7/26; H01L 21/30; C23F 1/08
[52] U.S. Cl. ....................... 430/313; 430/8; 430/167; 430/194; 430/197; 430/296; 430/320; 430/323; 430/325; 156/643
[58] Field of Search .............. 430/8, 323, 167, 197, 430/194, 296, 313, 320, 325; 156/643

[56] References Cited

U.S. PATENT DOCUMENTS

| | | | |
|---|---|---|---|
| 3,869,292 | 3/1975 | Peters | 430/197 |
| 4,148,655 | 4/1979 | Itoh et al. | 430/197 |
| 4,241,165 | 12/1980 | Hughes et al. | 430/197 |
| 4,289,845 | 9/1981 | Bowden et al. | 156/643 |
| 4,307,178 | 12/1981 | Kaplan et al. | 156/643 |
| 4,307,179 | 12/1981 | Chang et al. | 156/643 |
| 4,469,778 | 9/1984 | Iwayanagi et al. | 430/197 |

FOREIGN PATENT DOCUMENTS

2079481  1/1982  United Kingdom ............ 430/197

OTHER PUBLICATIONS

Iwayanagi, T. et al., *J. Electrochem. Soc.*, vol. 127, No. 12, 12/1980, pp. 2759–2760.
Tsunoda et al., *Photo Sci. Eng.*, vol. 17, No. 4, 7/1973, pp. 390–393.
Matsuzawa et al., IEEE Transactions on Electron Devices, vol. Ed.-28, No. 11, 11/1981, pp. 1284–1288.
Deckert et al., "Microlithography . . . Fabrication", Journal of the Electrochemical Society, 3/1980, pp. 45C–56C.

*Primary Examiner*—Charles L. Bowers, Jr.
*Attorney, Agent, or Firm*—Antonelli, Terry & Wands

[57] ABSTRACT

A film of a photoresist having phenolic hydroxyl groups is irradiated with far-ultraviolet radiation, and is thereafter developed with an alkaline aqueous solution. Using as a mask a resist pattern thus obtained, dry etching is carried out to form a microscopic pattern. Since the photoresist is highly immune against the dry etching, the microscopic pattern can be formed at a high precision. By adding an azide of a specified structure, the photoresist has its sensitivity to the far-ultraviolet radiation enhanced more.

31 Claims, 1 Drawing Figure

METHOD OF FORMING A MICROSCOPIC PATTERN WITH FAR UV PATTERN EXPOSURE, ALKALINE SOLUTION DEVELOPMENT, AND DRY ETCHING

This is a continuation of application Ser. No. 265,170 filed May 19, 1981, abandoned.

BACKGROUND OF THE INVENTION

1. Field of the Invention

This invention relates to a method of forming a microscopic pattern. More particularly, it relates to a method in which a pattern of a photoresist having a high sensitivity to the far-ultraviolet radiation, a high resolution and a high resistance against dry etching is formed and is used to form a microscopic pattern of a desired work piece.

2. Description of the Prior Art

As various semiconductor devices have become high in the density and high in the integration degree in recent years, a method which can readily form a microscopic pattern 0.5–2 $\mu$m wide at a high precision has been necessitated.

Heretofore, various patterns of semiconductor devices have been formed by a technology called "photolithography", for which exposure to ultraviolet radiation having wavelengths of approximately 320–500 nm and wet etching employing a liquid etchant have been commonly practised.

However, when the exposure of a photoresist film is performed with the ultraviolet radiation having the wavelengths of 320–500 nm, properties inherent in radiation such as diffraction and interference render it difficult to precisely form the microscopic pattern having the width of 0.5–2 $\mu$m.

When the etching is performed by the wet etching employing the liquid etchant, the precision of formation of a pattern lowers due to the side etching etc. It is therefore difficult to precisely form the microscopic pattern.

Since, as thus far described, the microscopic pattern cannot be formed at the high precision with the hitherto conventional method, there has been proposed a method which employs for the exposure, ultraviolet radiation having wavelengths of approximately 200–320 nm shorter than the wavelengths of the aforecited ultraviolet radiation (such ultraviolet radiation of the shorter wavelengths shall be written "far-ultraviolet radiation" in this specification) and which employs for the etching, various dry etchings employing no liquid etchant.

This measure eliminates both the influences of the diffraction and interference of the radiation ascribable to the use of the ultraviolet radiation of the longer wavelengths for the exposure and the lowering of the precision due to the side etching in the etching step, so that the formation of the microscopic pattern ought to be possible.

However, it has hitherto been impossible to achieve sufficiently good results because of nonexistence of any photoresist suitable for both the exposure to the far-ultraviolet radiation and the dry etching.

By way of example, polymethyl methacrylate (abbreviated to "PMMA") and polymethyl isopropenyl ketone (abbreviated to "PMIPK") are usually used as photoresists for the far-ultraviolet radiation. Although these photoresists are excellent in point of the resolution, they have an insufficient sensitivity to the far-ultraviolet radiation and require a long time for the exposure, and moreover, they are insufficient in point of the resistance against the dry etching and incur a great damage of a resist pattern during the dry etching step. It has therefore been difficult to put them into practical use. In particular, it is a fatal disadvantage in practical use that the resistance against the dry etching is low.

SUMMARY OF THE INVENTION

An object of this invention is to solve the problems of the prior arts and to provide a microscopic pattern-forming method which can form a microscopic pattern at a high precision by the use of the exposure to the far-ultraviolet radiation and the dry etching.

In order to accomplish the object, according to this invention, an alkali-soluble, negative type photoresist having phenolic hydroxyl groups is employed, to enhance the dry etching resistance and further, an aromatic azide having a specified structure is added thereto, to remarkably enhance the sensitivity to the far-ultraviolet radiation.

BRIEF DESCRIPTION OF THE DRAWING

The single FIGURE is a graph showing the relationship between the exposure time and the thickness of a developed film at the time when poly(p-vinyl phenol) or the addition condensation product between m-cresol as well as phenol and formaldehyde was irradiated with the far-ultraviolet radiation and then developed.

DETAILED DESCRIPTION OF THE PREFERRED EMBODIMENTS

Figure 1:
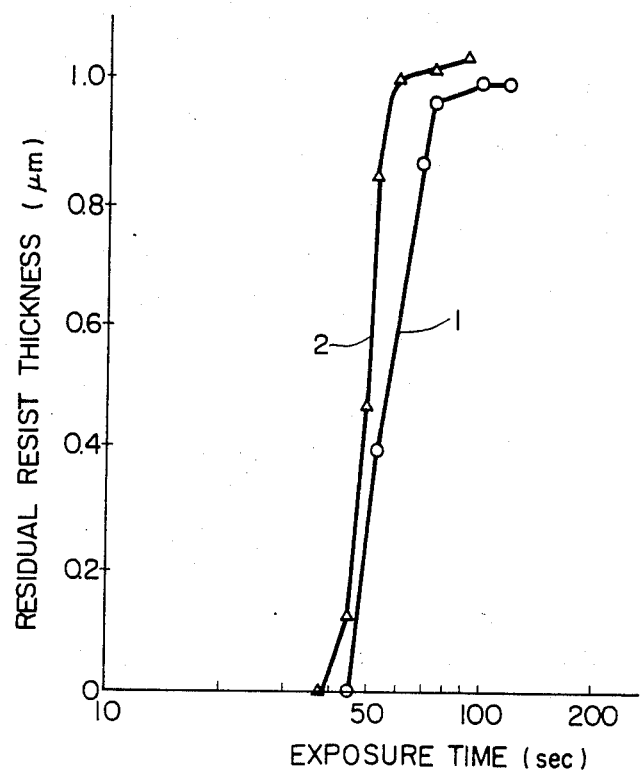

The hitherto-known, positive type photoresists for the far-ultraviolet radiation such as PMMA and PMIPK utilize the property that, when irradiated with the radiation, a polymer constituting the resist causes decomposition of the type severing the main chain and turns into a low-molecular weight, to become easy of dissolving in a liquid developer.

In case where the positive type photoresist having such property is used for the dry etching, it can be said that the resistance against the dry etching is, in principle, low because the photoresist is liable to be decomposed into the low molecular weight by the irradiating radiation.

On the other hand, the negative type photoresist is quite different from the positive type photoresist in the functional effect by radiation, and hence, its resistance against the dry etching is considered to be much higher.

However, the high resistance against the dry etching does not mean that all the negative type photoresists are usable.

As prior-art, negative type photoresists which can be used for the far-ultraviolet radiation, there have been known, for example, chloromethylated polystyrene and a cyclized rubber type resist whose sensitive component is a bisazide having the maximum absorption wavelength in the far-ultraviolet region.

Contrariwise to the case of the positive type photoresists, these negative type photoresists are superior in the resistance against the dry etching and in the sensitivity, but are inferior in the resolution. Therefore, it is also difficult to employ them for the formation of the microscopic pattern.

More specifically, these negative type photoresists exploit the property that when irradiation with the radiation is carried out, a three-dimensional network structure is formed by a cross-linking reaction, to turn the resist into a high molecular weight and to render it insoluble. Therefore, the resistance against the dry etching is higher than in the case of the positive type photoresists.

The prior-art, negative type photoresists, however, have the disadvantage that when the photoresist is dipped in a liquid developer after the exposure in order to form a resist pattern, the exposed part thereof is swollen by the liquid developer, so the pattern is prone to meander due to a stress which acts in the succeeding drying treatment.

It is therefore difficult to make the aspect ratio (the ratio between the residual thickness of the resist pattern after the developing and the width of a resolvable line) 1 (one) or greater. By way of example, when the residual thickness of the photoresist is 1 $\mu$m, a pattern whose line width and spacing are less than 1 $\mu$m cannot be formed.

The inventor has found out that when a polymer having phenolic hydroxyl groups is employed as a photoresist and is irradiated with the far-ultraviolet radiation and thereafter developed by an alkaline solution, a photoresist pattern whose resistance against the dry etching is high and whose resolution is very high is formed. Further, it has been found out that when a photoresist is formed by adding a certain kind of aromatic azide to the polymer having phenolic hydroxyl groups, the sensitivity to the far-ultraviolet radiation rises remarkably.

Accordingly, when such negative type photoresist is subjected to exposure to the far-ultraviolet radiation and is developed to obtain a photoresist pattern and a film to form a microscopic pattern is etched by the dry etching by employing the photoresist pattern as a mask, the microscopic pattern whose line width and spacing are approximately 0.5-2 $\mu$m can be formed at a very high precision.

This invention will be described more in detail in conjunction with examples.

EXAMPLE 1

Polyvinyl phenol, novolac resins being the addition condensation products between phenols and formaldehyde, etc. dissolve in alkaline aqueous solutions. However, when irradiated with the far-ultraviolet radiation, they have their solubilities for the alkaline aqueous solutions reduced to become insoluble therein. Therefore, they can be used as the negative type photoresists for the far-ultraviolet radiation.

The addition condensation product (the so-called novolac resin) between m-cresol and formaldehyde, and poly(p-vinyl phenol) were applied on silicon substrates separately from each other, they were irradiated with the far-ultraviolet radiation whose intensity was 5.5 mW/cm$^2$ at a wavelength of 254 nm, and they were dipped in a 2% aqueous solution of tetramethylammonium hydroxide. The relationships between the exposure time of the far-ultraviolet radiation and the residual resist thickness at that time were measured, and results shown by curves 1 and 2 in the single FIGURE respectively were obtained. Even when m-cresol was replaced with other cresols or phenols, substantially the same results were obtained. In addition, even when the cresols and phenols were jointly used, the circumstances were substantially the same.

As apparent from the FIGURE, both the two sorts of resins began to become insoluble in the alkaline aqueous solution owing to the exposure to the far-ultraviolet radiation for approximately 40-50 seconds. It is indicated that when the exposure time increased, also the residual resist thickness increased, so the insolubility proceeded. With the exposure for more than approximately 80 seconds, the residual resist thickness scarcely changed.

In view of these facts, both the poly(p-vinyl phenol) and the novolac resin can be used as the negative type photoresists for the far-ultraviolet radiation. Moreover, as apparent from the FIGURE, they have high contrasts with respect to the quantities of exposure.

Therefore, repetition patterns in each of which both the line width and spacing were 1 $\mu$m could be precisely formed by the use of the resins. An observation with a scanning electron microscope has revealed that the side surfaces of the patterns obtained in this example were more abrupt than in the case of employing the prior-art photoresists.

Whereas the prior-art, negative type photoresists swell in the developing step as stated before, the photoresists according to this example exploit the insolubilization not relying on any cross-linking reaction and are not feared to undergo the swelling or the meandering.

Regarding the resistance against the dry etching, when the photoresists were etched for 20 minutes by the reactive sputtering (2.25 A, 20 Pa) employing a mixed gas consisting of $C_4F_8$: He=1:1 (in terms of the volumetric ratio), their weight reduction rates based on the exposure for 100 seconds by the aforecited radiation source were 23%.

This value is more excellent than the weight reduction rate 35% under the same conditions, of AZ1350J (trade name, produced by Shipley Inc.) which is said to exhibit the highest resistance against the dry etching among prior-art photoresists. Conjointly with the abrupt sectional shape, the weight reduction rate is very suitable for the photoresist for the dry etching.

As the resist materials, not only the above-mentioned two sorts of substances, but also polymers being soluble in alkaline aqueous solutions and having phenolic hydroxyl groups such as bromides of poly(vinyl phenol), poly(vinyl hydroxybenzoate) and poly(vinyl hyroxybenzal) can be extensively used.

EXAMPLE 2

Phenol type and cresol type novolac resins, polyvinyl phenol, polyisopropenyl phenol, etc. were used as alkali-soluble high polymers having phenolic hydroxyl groups, and they were respectively irradiated with the far-ultraviolet radiation and developed with alkaline solutions. Then, favorable resist patterns which were extraordinarily high in the dry etching-immunity were formed.

When certain kinds of aromatic azides are added to these compounds, the sensitivity to the far-ultraviolet radiation is remarkably raised, and very favorable characteristics meeting all the conditions of the high sensitivity, the high resolution and the dry etching resistance are attained.

The aromatic azide which fulfills the conditions and which is used in this invention requires that it exhibits the maximum absorption in the far-ultraviolet region of wavelengths of approximately 200-320 nm and that it does not exhibit any great absorption in a region of wavelengths of above approximately 320 nm.

The great absorption in the far-ultraviolet region is required for the possession of the high sensitivity to the far-ultraviolet radiation. It is required for the following two reasons that no great absorption is exhibited in the region above 320 nm.

As the first reason, in case where the photoresist film is irradiated with the radiation of the wavelengths longer than those of the far-ultraviolet radiation on account of an unsatisfactory filter for the irradiation spectrum of a lamp used for the exposure, the existence of the great absorption in the longer wavelength region will degrade the resolution under the influence of the longer wavelength radiation.

As the second reason, unless the radiation of the wavelengths above 320 nm is absorbed, all the steps to handle the photoresist can be carried out under the ordinary illumination, and the yellow safety light is dispensed with.

Among aromatic azides satisfying such requirements, ones which have a structure indicated by the following general formula (1) are preferable in practical use:

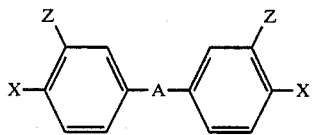
(1)

Here, letter A denotes an element or substituent unconjugate with two benzene rings, such as O, S, $CH_2$, $CH_2CH_2$, $SO_2$ and $S_2$; letter X denotes H or $N_3$; and letter Z denotes a substituent $N_3$ when X is H and an element H or Cl when X is $N_3$.

In order that the maximum absorption may be exhibited in the far-ultraviolet region of the wavelengths of 200–320 nm and that no great absorption may be exhibited beyond 320 nm, A in the structure indicated by Formula (1) needs to be the element or substituent which is not conjugate with the benzene rings. Among azides each having only one benzene ring, there are ones fulfilling the aforecited requirements. However, they have such a disadvantage that since they have low boiling points, they volatilize in a prebaking step which is carried out previously to the exposure. Therefore, the azides having the composition represented by Formula (1) are favorable in practical use.

EXAMPLE 3

A photoresist was prepared in such a way that 20 gr. of a novolac resin of the type of the copolymerization between phenol and m-cresol and 4 gr. of 4,4'-diazidediphenylsulfide were dissolved in 80 gr. of methyl cellosolve acetate.

The photoresist was applied by the spin coating onto a phosphosilicate glass film 0.5 μm thick deposited on a silicon wafer and was dried, to form a photoresist film approximately 0.9 μm thick.

Using a xenon-mercury-vapor lamp of 500 W as a radiation source, the photoresist film was exposed to radiation for 1.5 second through a chromium mask formed on a synthetic quartz substrate. In this case, to the ends of eliminating the influence of the longer wavelength radiation and preventing the wafer from being heated by the infrared radiation, a cold mirror adapted to absorb radiation of wavelengths longer than 300 nm was used to reflect only radiation of wavelengths of and below 300 nm in the radiation from the radiation source and to expose the photoresist film to the reflected radiation.

The photoresist film thus exposed to the far-ultraviolet radiation having the wavelengths of 200–300 nm was developed by an aqueous solution containing 2% of tetramethylammonium hydroxide as an alkali component, to dissolve and remove the unexposed part of the photoresist film. Then, a rectilinear repetition photoresist pattern having a line width of 1 μm and a spacing of 1 μm could be formed at a very high precision.

Using the photoresist pattern as a mask, the resultant wafer was etched for 10 minutes in a reactive sputter-etching equipment (2.25 A, 20 Pa) which employed a mixed gas consisting of $C_4F_8$: He=1:1. Then, a repetition pattern of phosphosilicate glass faithful to the mask of the resist was obtained.

On the other hand, a pattern was formed by similar operations by the use of polymethyl methacrylate (PMMA) known as the prior-art typical photoresist for the far-ultraviolet radiation. Herein, an exposure for about 300 seconds was necessary for forming a good photoresist pattern. This invention was revealed to require the exposure time equal to only 1/200 of that of the prior art.

As explained before, PMMA is the photodecomposing positive type photoresist and is therefore low in the resistance against the dry etching. A good microscopic pattern of a silicon oxide film could not be formed.

EXAMPLE 4

A photoresist was prepared in such a way that 20 gr. of poly(p-vinyl phenol) (produced by Maruzen Sekiyu Kabushiki-Kaisha, trade name: Maruzen Resin M) and 4 gr. of 3,3'-diazidediphenylsulfone were dissolved in 80 gr. of methyl cellosolve acetate.

Using the photoresist, a pattern was formed similarly to Example 3 (except that the exposure time was 2 seconds). Likewise to the case of Example 3, a good microscopic pattern was obtained.

EXAMPLE 5

A photoresist film of the composition used in Example 4 was formed by the same method as in Example 3, and was irradiated with the far-ultraviolet radiation. In case of this example, however, the photoresist film was irradiated over the whole surface without employing any mask, and the exposure time was 2 seconds.

The resultant photoresist film was etched by the reactive sputtering in which a mixed gas (0.2 Torr) consisting of $C_4F_8$ and He at 1:1 was used as an etching gas. The rate of weight reduction by the etching was measured to be 22%.

For the sake of comparison, as to the photoresist AZ1350J produced by Shipley Inc. as is said the photoresist having the highest resistance against the dry etching among the photoresists hitherto used, the rate of weight reduction by the reactive sputter-etching was evaluated under the same conditions, and a value of 35% was obtained.

It has thus been noted that the photoresist used in the present invention is about 1.5 times as excellent as the photoresist heretofore said the best in point of the resistance against the dry etching, and that it is very suitable for the formation of a microscopic pattern.

EXAMPLE 6

As stated before, it is favorable that the aromatic azide for use in the present invention has the structure indicated by Formula (1).

Some of the aromatic azides having such structure are listed in Table 1. All these aromatic azides have the maximum absorptions in the far-ultraviolet region as apparent from Table 1, and they produced good results when applied to this invention.

As is well known, the existence of sodium or potassium ions is extremely unfavorable for the fabrication of semiconductor devices. Therefore, when this invention

TABLE 1

| Designation | Structural formula | Max.-absorption wavelength (nm) | Melting point (°C.) |
|---|---|---|---|
| 4,4'-diazidediphenylsulfide | $N_3-\langle\bigcirc\rangle-S-\langle\bigcirc\rangle-N_3$ | 273 | 90 |
| 4,4'-diazidediphenylsulfone | $N_3-\langle\bigcirc\rangle-SO_2-\langle\bigcirc\rangle-N_3$ | 284 | 163 |
| 3,3'-diazidediphenylsulfone | $N_3-\langle\bigcirc\rangle-SO_2-\langle\bigcirc\rangle-N_3$ | 240 | 116 |
| 4,4'-diazidediphenylmethane | $N_3-\langle\bigcirc\rangle-CH_2-\langle\bigcirc\rangle-N_3$ | 256 | 44 |
| 3,3'-dichloro-4,4'-diazidediphenylmethane | $N_3-\langle\bigcirc(Cl)\rangle-CH_2-\langle\bigcirc(Cl)\rangle-N_3$ | 258 | 128 |
| 4,4'-diazidediphenylether | $N_3-\langle\bigcirc\rangle-O-\langle\bigcirc\rangle-N_3$ | 264 | 77 |
| 4,4'-diazidediphenyldisulfide | $N_3-\langle\bigcirc\rangle-S-S-\langle\bigcirc\rangle-N_3$ | 266 | 37 |
| 4,4'-diazidebibenzyl | $N_3-\langle\bigcirc\rangle-CH_2-CH_2-\langle\bigcirc\rangle-N_3$ | 254 | 80 |

As the high molecular compound, the polymer having phenolic hydroxyl groups can be employed as stated before.

Such polymers include novolac resins being the addition condensation products between phenols or cresols and formaldehyde, polyvinyl phenol, polyisopropenyl phenol, etc. All produced favorable results when they were applied to this invention.

As the liquid developer in this invention, there can be employed an alkaline aqueous solution obtained by dissolving, for example, sodium hydroxide, potassium hydroxide, sodium phosphate, sodium silicate, or tetramethylammonium hydroxide in water. With an organic solvent, also the exposed area of the photoresist dissolves partly, or it swells to some extent even when it does not dissolve. The use of the organic solvent is therefore unfavorable in that the precise formation of a microscopic pattern is difficult.

is to be applied to the production of semiconductor devices, a liquid developer which contains neither sodium nor potassium is selected.

However, in case of adopting this invention for the production of a magnetic bubble memory device, liquid developers which contain sodium and potassium in such forms as sodium hydroxide and potassium hydroxide can be used because the existence of sodium and potassium forms quite no hindrance.

The concentrations, temperatures and developing times of these liquid developers are, of course, conspicuously different depending upon many factors including the kind of the liquid developer used, the kine of the photoresist, the thickness of the resist film, etc., but they are roughly 0.1–10 weight-%, 10°–40° C. and 10–600 seconds respectively.

As the dry etching, it is possible to employ a well-known dry etching such as plasma etching resorting to a cylindrical type plasma etching equipment or a parallel-plate type plasma etching equipment, reactive sputter etching, sputter etching and microwave plasma etching.

As apparent from the above description, according to this invention, the exposure to the far-ultraviolet radiation and the dry etching can be effectively utilized, so that a microscopic pattern can be formed at an extraordinarily high precision. The invention is especially useful for the production of semiconductor devices of high packaging densities and magnetic bubble memory devices.

What is claimed is:

1. A method of forming a microscopic pattern, including:
   (1) the step of forming a photoresist film on a substance to form the microscopic pattern, the photoresist film containing a polymer, having phenolic hydroxyl groups, that is soluble in alkaline aqueous solution, and further containing an aromatic azide which is represented by a general formula:

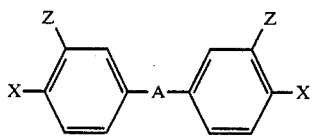

(where A denotes an element or substituent unconjugate with two benzene rings, X denotes H or $N_3$, and Z denotes $N_3$ and X is H and it denotes H or Cl when X is $N_3$), said photoresist film absorbing far-ultraviolet radiation while substantially not exhibiting absorption of radiation in the region above 320 nm, whereby resolution is improved due to the absorption of far-ultraviolet radiation without absorption of radiation above 320 nm,
   (2) the step of irradiating a desired part of said photoresist film with far-ultraviolet radiation, to lower a solubility in alkaline aqueous solution of the irradiated part,
   (3) the step of developing the irradiated photoresist film with an alkaline aqueous solution, to remove the unirradiated part of said photoresist film and to form a photoresist pattern without swelling or meandering of the irradiated part, whereby the unirradiated part is removed without swelling or meandering of the irradiated part, and
   (4) the step of performing dry etching by employing said photoresist pattern as a mask, to form said microscopic pattern of said substance, whereby a microscopic pattern having line widths and spacings of 0.5-2 $\mu$m can be formed with high precision.

2. A method of forming a microscopic pattern according to claim 1, wherein said polymer is selected from the group consisting of novolac resins produced from formaldehyde and phenols.

3. A method of forming a microscopic pattern according to claim 4, wherein said aromatic azide is selected from the group consisting of 4,4'-diazideidiphenylsulfide 4,4'-diazidediphenylsulfone, 3,3'-diazidediphenylsulfone, 4,4'-diazidediphenylmethane, 3,3'-dichloro-4,4'-diazidediphenylmethane, 4,4'-diazidediphenylether, 4,4'-diazidediphenylsulfide, and 4,4'-diazidediphenyldisulfide.

4. A method of forming a microscopic pattern according to claim 2, wherein said alkaline aqueous solution is an aqueous solution of a member selected from the group consisting of sodium hydroxide, potassium hydroxide, sodium phosphate, sodium silicate, and tetraalkylammonium hydroxide.

5. A method of forming a microscopic pattern according to claim 2, wherein A is selected from the group consisting of O, S, $CH_2$, $CH_2CH_2$, $SO_2$ and $S_2$.

6. A method of forming a microscopic pattern according to claim 2, wherein said microscopic pattern has line widths and spacings of 0.5-2 $\mu$m.

7. A method of forming a microscopic pattern according to claim 2, wherein said substance is a substrate for a semiconductor device, and said alkaline aqueous solution does not contain either sodium or potassium.

8. A method of forming a microscopic pattern according to claim 2, wherein the photoresist film is sufficiently resistant to dry etching after irradiation thereof with far-ultraviolet radiation such that said film can be used as a mask for said dry etching.

9. A method of forming a microscopic pattern according to claim 2, wherein said desired part of said photoresist film is irradiated with substantially only far-ultraviolet radiation.

10. A method of forming a microscopic pattern according to claim 2, wherein said substance is a substrate for a magnetic bubble device.

11. A method for forming a microscopic pattern according to claim 2, wherein the step of developing is performed using an alkaline aqueous solution having a concentration of 0.1-10 wt%, with the developing being performed at a temperature of 10°-40° C., for 10-600 seconds.

12. A method of forming a microscopic pattern according to claim 1, wherein said polymer is selected from the group consisting of poly(vinyl hydroxylbenzoate), poly(vinyl hydroxybenzal), bromides of polyvinyl phenol and polyisopropenyl phenol.

13. A method of forming a microscopic pattern according to claim 12, wherein said alkaline aqueous solution is an aqueous solution of a member selected from the group consisting of sodium hydroxide, potassium hydroxide, sodium phosphate, sodium silicate, and tetraalkylammonium hydroxide.

14. A method of forming a microscopic pattern according to claim 12, wherein said microscopic pattern has line widths and spacings of 0.5-2 $\mu$m.

15. A method of forming a microscopic pattern according to claim 12, wherein said substance is a substrate for a semiconductor device, and said alkaline aqueous solution does not contain either sodium or potassium.

16. A method of forming a microscopic pattern according to claim 12, wherein said substance is a substrate for a magnetic bubble device.

17. A method of forming a microscopic pattern according to claim 12, wherein A is selected from the group consisting of O, S, $CH_2$, $CH_2CH_2$, $SO_2$ and $S_2$.

18. A method of forming a microscopic pattern according to claim 12, wherein the photoresist film is sufficiently resistant to dry etching after irradiation thereof with far-ultraviolet radiation such that said film can be used as a mask for said dry etching.

19. A method of forming a microscopic pattern according to claim 12, wherein said desired part of said photoresist film is irradiated with substantially only far-ultraviolet radiation.

20. A method for forming a microscopic pattern according to claim 12, wherein the step of developing is performed using an alkaline aqueous solution having a concentration of 0.1–10 wt%, with the developing being performed at a temperature of 10°–40° C., for 10–600 seconds.

21. A method of forming a microscopic pattern according to claim 12, wherein said aromatic azide is selected from the group consisting of 4,4'-diazidediphenylsulfide, 4,4'-diazidediphenylsulfone, 3,3'-diazidediphenylsulfone, 4,4'-diazidediphenylmethane, 3,3'-dichloro-4,4'-diazidediphenylmethane, 4,4'-diazidediphenylether, 4,4'-diazidediphenyldisulfide, and 4,4'-diazidebibenzyl.

22. A method of forming a microscopic pattern according to claim 1, wherein said polymer is polyvinyl phenol.

23. A method of forming a microscopic pattern according to claim 22, wherein said microscopic pattern has line widths and spacings of 0.5–2 μm.

24. A method of forming a microscopic pattern according to claim 22, wherein said alkaline aqueous solution is an aqueous solution of a member selected from the group consisting of sodium hydroxide, potassium hydroxide, sodium phosphate, sodium silicate and tetraalkylammonium hydroxide.

25. A method of forming a microscopic pattern according to claim 22, wherein A is selected from the group consisting of O, S, $CH_2$, $CH_2CH_2$, $SO_2$ and $S_2$.

26. A method of forming a microscopic pattern according to claim 22, wherein said substance is a substrate for a semiconductor device, and said alkaline aqueous solution does not contain either sodium or potassium.

27. A method of forming a microscopic pattern according to claim 22, wherein the photoresist film is sufficiently resistant to dry etching after irradiation thereof with far-ultraviolet radiation such that said film can be used as a mask for said dry etching.

28. A method of forming a microscopic pattern according to claim 22, wherein said desired part of said photoresist film is irradiated with substantially only far-ultraviolet radiation.

29. A method of forming a microscopic pattern according to claim 22, wherein said substance is a substrate for a magnetic bubble device.

30. A method for forming a microscopic pattern according to claim 22, wherein the step of developing is performed using an alkaline aqueous solution having a concentration of 0.1–10 wt%, with the developing being performed at a temperature of 10°–40° C., for 10–600 seconds.

31. A method of forming a microscopic pattern according to claim 22, wherein said aromatic azide is selected from the group consisting of 4,4'-diazidediphenylsulfide, 4,4'-diazidediphenylsulfone, 3,3'-diazidediphenylsulfone, 4,4'-diazidediphenylmethane, 3,3'-dichloro-4,4'-diazidediphenylmethane, 4,4'-diazidediphenylether, 4,4'-diazidediphenyldisulfide, and 4,4'-diazidebibenzyl.

* * * * *